(12) United States Patent
Dinev et al.

(10) Patent No.: US 8,920,599 B2
(45) Date of Patent: Dec. 30, 2014

(54) HIGH EFFICIENCY GAS DISSOCIATION IN INDUCTIVELY COUPLED PLASMA REACTOR WITH IMPROVED UNIFORMITY

(75) Inventors: Jivko Dinev, Santa Clara, CA (US); Saravjeet Singh, Santa Clara, CA (US); Roy C. Nangoy, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 243 days.

(21) Appl. No.: 13/270,623

(22) Filed: Oct. 11, 2011

(65) Prior Publication Data

US 2012/0091098 A1  Apr. 19, 2012

Related U.S. Application Data

(60) Provisional application No. 61/394,526, filed on Oct. 19, 2010.

(51) Int. Cl.
*H01L 21/306* (2006.01)
*C23C 16/00* (2006.01)
*H01J 37/32* (2006.01)
*C23C 16/507* (2006.01)

(52) U.S. Cl.
CPC ........... *H01J 37/321* (2013.01); *H01J 37/3211* (2013.01); *C23C 16/507* (2013.01)
USPC .............. 156/345.48; 118/723 I; 118/723 AN

(58) Field of Classification Search
CPC  H01J 37/321; H01J 37/3211; H01J 37/32119
USPC ....... 118/723 I, 723 IR, 723 AN; 156/345.48, 156/345.49; 315/111.51
See application file for complete search history.

(56) References Cited

U.S. PATENT DOCUMENTS

| 6,164,241 | A | * | 12/2000 | Chen et al. | |
| 2003/0094238 | A1 | * | 5/2003 | Strang et al. | 156/345.48 |
| 2007/0037397 | A1 | * | 2/2007 | Lu et al. | 438/710 |
| 2009/0236315 | A1 | | 9/2009 | Willwerth et al. | |
| 2009/0314434 | A1 | * | 12/2009 | Song et al. | 156/345.48 |

FOREIGN PATENT DOCUMENTS

| JP | 2004-529486 | 9/2004 |
| KR | 10-2004-0042892 | 5/2004 |

* cited by examiner

*Primary Examiner* — Luz Alejandro Mulero
(74) *Attorney, Agent, or Firm* — Patterson & Sheridan, LLP

(57) ABSTRACT

Embodiments of the present invention relate to a plasma chamber having a coil assembly which improves plasma uniformity and improves power coupling to the plasma. One embodiment provides a plasma chamber. The plasma chamber includes a chamber body having sidewalls and a lid, wherein the chamber body defines a processing volume. The plasma chamber further includes a coil assembly disposed over the lid configured to generate inductively coupled plasma within the processing volume, wherein the coil assembly comprises two or more horizontal coils arranged in a common horizontal plane.

13 Claims, 5 Drawing Sheets

HIGH EFFICIENCY GAS DISSOCIATION IN INDUCTIVELY COUPLED PLASMA REACTOR WITH IMPROVED UNIFORMITY

CROSS REFERENCE TO RELATED APPLICATIONS

This application claims priority to U.S. Provisional Patent Application Ser. No. 61/394,526, filed Oct. 19, 2010, which is incorporated herein by reference.

BACKGROUND

1. Field

Embodiments of the present invention generally relate to semiconductor substrate processing systems. More specifically, the invention relates to a coil assembly along with gas delivery for a plasma processing system.

2. Background

The fabrication of microelectronic devices includes a number of different stages, each including a variety of processes. During one stage, a particular process may include transmitting plasma to the surface of a substrate, such as a silicon substrate, to alter the physical and material properties of the substrate. This process may be known as etching, which may involve the removal of materials to form holes, vias, and/or other openings in the substrate. Polymer deposition is generally used along with the etching to protect the side walls.

Many semiconductor devices are processed in the presence of plasma in a processing chamber. Inductively coupled plasma (ICP) is one type of plasma source used in semiconductor processing. An ICP reactor generates plasma in a processing volume by supplying high frequency electrical current to coils disposed outside the processing volume. ICP reactors are capable of generating high-density, low pressure plasma and relatively free of contamination. Studies have shown that silicon etch rate and polymer deposition rate are proportional to the plasma density.

FIG. 1 schematically illustrates a conventional ICP reactor 10. The plasma reactor 10 includes a chamber body 11 which defines an inner volume 15 for processing a substrate 12 therein. Processing gases are supplied to the inner volume 15 from a gas source 16. One or two co-axial helical coils 13, 14 are disposed outside the inner volume 15. The helical coils 13 and 14 are coupled to a high frequency power source 17 to provide time varying electric currents to the helical coils 13, 14 which generate electromagnetic field to breaks down processing gases and form plasma in the inner volume 15.

The inventors have discovered that improvements to the design of the gas delivery and the coil assembly in a plasma processing chamber have substantially higher plasma density and have a beneficial effect on plasma uniformity and power coupling to the outer region of the plasma.

SUMMARY

Embodiments of the present invention generally relate to apparatus and methods to increase the plasma density and improve process uniformity and power coupling in a plasma chamber. More particularly, embodiments of the present invention relate to a plasma chamber having an additional small cavity on top of the plasma chamber and an alternate coil assembly which improves plasma density and uniformity and improves power coupling to the plasma.

One embodiment provides a plasma chamber. The plasma chamber includes a chamber body having sidewalls and a lid, wherein the chamber body defines a processing volume. The plasma chamber further includes a coil assembly disposed over the lid configured to generate inductively coupled plasma within the processing volume, wherein the coil assembly includes two or more horizontal coils arranged in a common plane.

Another embodiment provides a plasma processing system. The plasma processing system includes a chamber body having sidewalls and a lid, wherein the chamber body defines a processing volume therein, and a substrate support disposed in the processing volume configured to support a substrate during processing. The plasma processing system further includes a coil assembly disposed over the lid and configured to generate plasma within the processing volume. The coil assembly includes an inner coil assembly positioned about a central axis of the substrate support, and an outer coil assembly having two or more horizontal coils arranged in a common plane and disposed radially outward of the inner coil assembly. In one embodiment, the lid comprises a baffle nozzle defining an extension volume, and the inner coil assembly is disposed about the baffle nozzle.

Yet another embodiment a method for processing a substrate. The method includes providing a plasma processing chamber. The plasma chamber includes a chamber body having sidewalls and a lid, wherein the chamber body defines a processing volume, and a coil assembly disposed over the lid configured to generate inductively coupled plasma within the processing volume, wherein the coil assembly includes two or more horizontal coils arranged in a common plane. The method further includes flowing one or more processing gases to the processing volume, and generating plasma for the one or more processing gases by applying a RF power to the two or more horizontal coils disposed over the lid.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
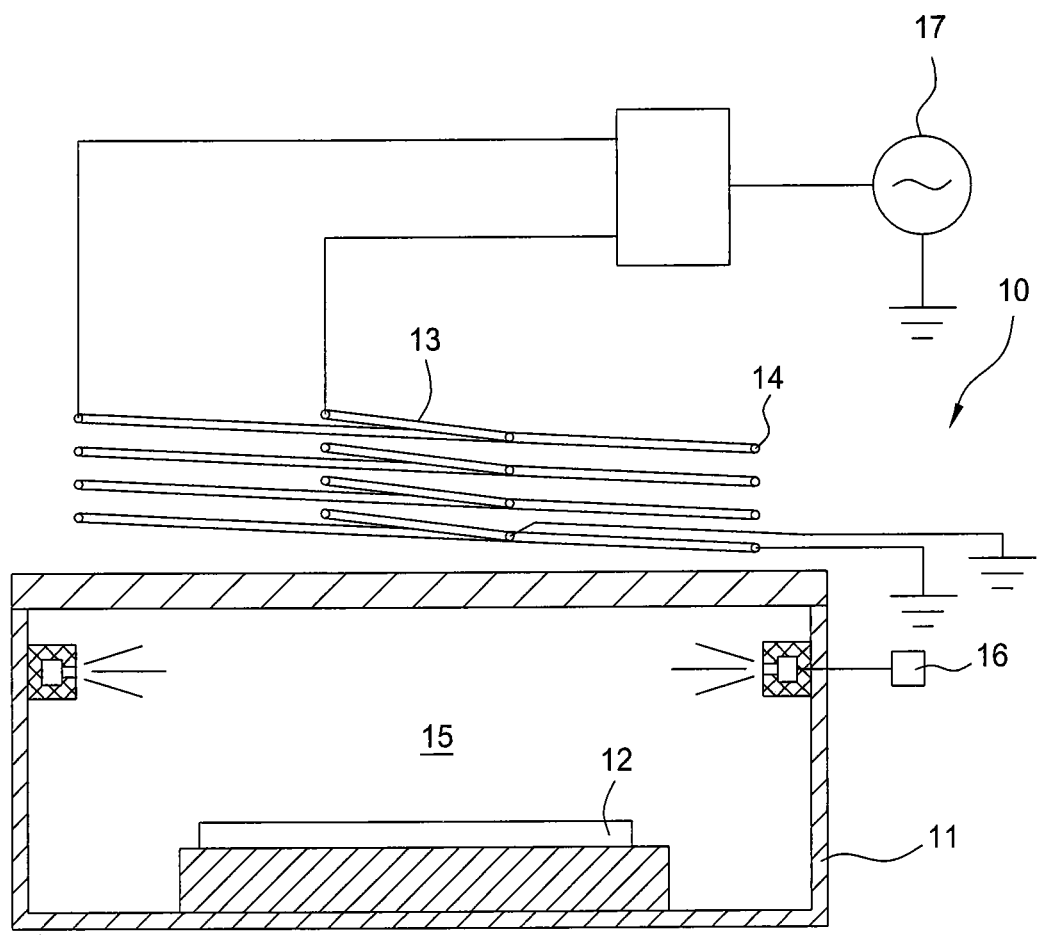
FIG. 1 schematically illustrates a conventional ICP reactor.

To facilitate understanding, identical reference numerals have been used, where possible, to designate identical elements that are common to the figures. It is also contemplated that elements and features of one embodiment may be beneficially incorporated on other embodiments without further recitation.

DETAILED DESCRIPTION

Embodiments of the present invention generally relate to apparatus and methods to improve process uniformity and power coupling in a plasma chamber. More particularly, embodiments of the present invention relate to a plasma chamber having a coil assembly which improves plasma uniformity and improves power coupling to the plasma.

Figure 2:
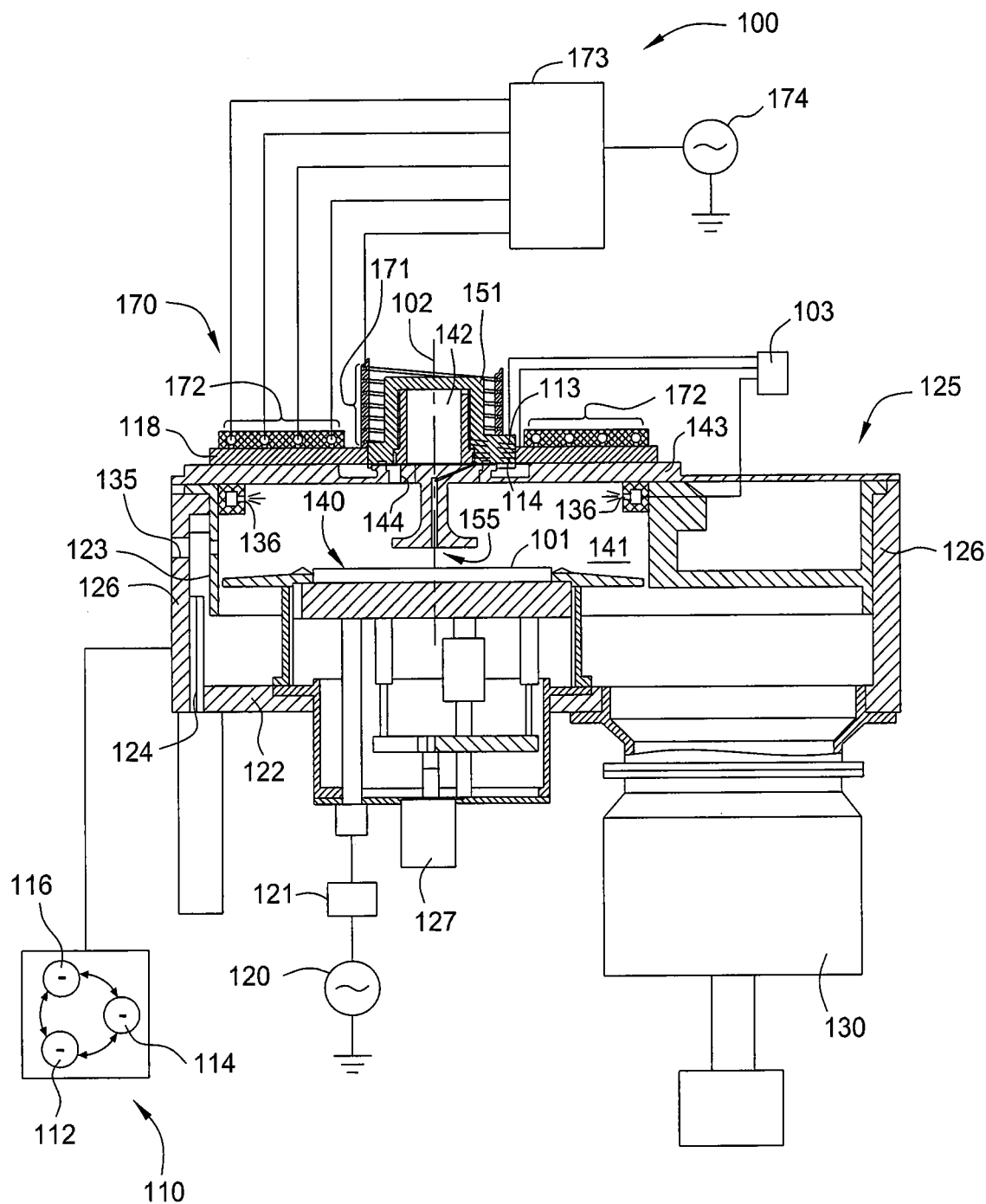
FIG. 2 depicts a sectional view of a plasma processing chamber in accordance with one embodiment of the present invention.

FIG. 2 depicts a sectional view of a plasma processing chamber 100 in accordance with one embodiment of the present invention. The plasma processing chamber 100 may be configured to process a variety of substrates, such as semiconductor substrates and reticles, and accommodating a variety of substrate sizes.

The plasma processing chamber 100 include a chamber body 125 defining a processing volume 141. In one embodiment, the chamber body 125 includes a bottom 122, sidewalls 126 and a lid 143 disposed over the sidewalls 126. The sidewalls 126 and bottom 122 are fabricated from a conductive material, such as stainless steel or aluminum. The lid 143 may be fabricated from aluminum, stainless steel, ceramic or other suitable material. In one embodiment, the lid 143 is a substantially flat ceramic member.

The plasma processing chamber 100 further includes a liner 123 disposed in the chamber body 125 to prevent the chamber body 125 from damages and contamination from the processing chemistry. A slit valve opening 135 is formed through the sidewall 126 and the liner 123 to allow passage of the substrates and substrate transfer mechanism. A slit valve door 124 selectively open and close the slit valve door opening 135. A vacuum pump 130 is fluid communication with the processing volume 141 and configured to maintain a low pressure environment within the processing volume 141.

A substrate support 140 is disposed in the processing volume 141. The substrate support 140 supports a substrate 101 during processing. A lift 127 is configured to raise and lower the substrate support 140 during processing and loading/unloading the substrate 101.

In one embodiment, the substrate support 140 is an electrostatic chuck coupled to a bias power 120 and a matching network 121. In one embodiment, the bias power 120 provides bias potential to a plasma generated in the processing volume 141.

In one embodiment, the lid 143 has an opening 144 to allow entrance of one or more processing gases to a central region of the processing volume 141 from a gas delivery system 103. In one embodiment, the opening 144 is disposed near a center axis 102 of the substrate support 140 and correspond to the center of the substrate 101 being processed.

In one embodiment, the plasma processing chamber 100 includes a chamber extension 151 disposed over the lid 143 covering the opening 144. The chamber extension 151 defines an extension volume 142 in fluid communication with the processing volume 141 via the opening 144. The extension volume 142 is connected to the gas delivery system 103 via inlet channels 113, 114.

In one embodiment, a baffle nozzle assembly 155 disposed through the opening 144 in the processing volume 141 and the extension volume 142. The baffle nozzle assembly 155 directs one or more processing gases into the processing volume 141 through the extension volume 142.

Detailed description of the chamber extension 151 and the baffle nozzle assembly 155 may be found in U.S. patent application Ser. No. 12/878,582, filed Sep. 9, 2010, entitled "Method and Apparatus for High Efficiency Gas Dissociation in Inductive Coupled Plasma Reactor", which is incorporated herein by reference.

In one embodiment, the plasma processing chamber 100 includes a plurality of nozzles 136 positioned around an edge region of the processing volume 141. The plurality of nozzles 136 are connected to the gas delivery system 103 and configured to inject one or more processing gases from the edge region radially inward to the processing volume 141.

In one embodiment, the plasma processing chamber 100 includes a heater 118 configured to control temperature of the lid 143. In one embodiment, the heater 118 is an electrically shielded resistive heater. Detailed description of the heater 118 may be found in U.S. patent application Ser. No. 12/408,348, filed Mar. 20, 2009, entitled "Shielded Lid Heater Assembly", and U.S. patent application Ser. No. 13/253,627, filed Oct. 5, 2011, entitled "Chamber Lid Heater Ring Assembly", which are incorporated herein by references.

The plasma processing chamber 100 includes an antenna assembly 170 disposed outside the chamber body 125. In one embodiment, the antenna assembly 170 is disposed over the heater 118. The antenna assembly 170 is coupled to a radio-frequency (RF) plasma power source 174 through a matching network 173. During processing, the antenna assembly 170 is energized with RF power provided by the power source 174 to ignite a plasma of processing gases within the processing volume 141 and to maintain the plasma.

The antenna assembly 170 may include one or more solenoidal interleaved coil antennas disposed coaxial with the central axis 102. In one embodiment, the antenna assembly 170 includes an inner coil assembly 171 and an outer coil assembly 172. The inner coil assembly 171 and the outer coil assembly 172 are coupled to the RF power source 174 through the matching network 173. In one embodiment, power supplied to the inner coil assembly 171 and the outer coil assembly 172 may be independently controlled.

The inner coil assembly 171 is disposed around the chamber extension 151 so that processing gases in the extension volume 142 may be ignited and a plasma can be maintained in the extension volume 142. In one embodiment, the inner coil assembly 171 is secured in place via inner braces 175.

The outer coil assembly 172 are disposed radially outwards of the inner coil assembly 171. The outer coil assembly 172 may be co-axial to the inner coil assembly 171. In one embodiment, the outer coil assembly 172 may be secured in position via outer braces 176.

Figure 3:
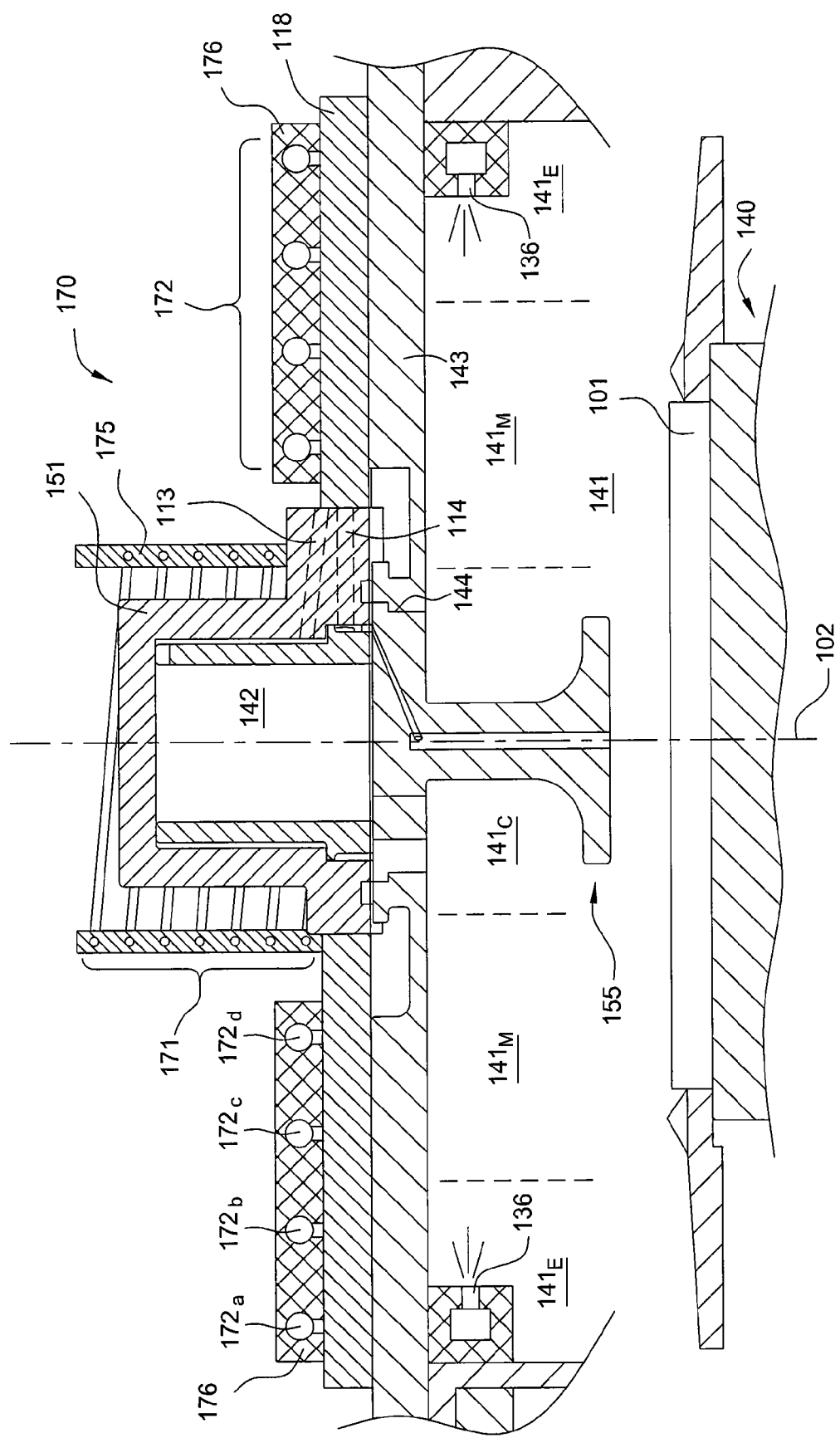
FIG. 3 depicts a partial enlarged sectional view of the plasma processing chamber of FIG. 2 showing a coil assembly.

FIG. 3 depicts a partial enlarged sectional view of the plasma processing chamber 100 showing details of the antenna assembly 170.

The inner coil assembly 171 includes one or more electrical conductors wound as a vertical spiral with small pitch and forming a helical coil. In one embodiment, the inner coil assembly 171 is a helical coil wound from two parallel wires.

When power is provided from the RF power source 174, electrical currents going through the inner coil assembly 171 establish a magnetic field, which may ignite and maintain a plasma.

Because the extension volume 142 is within the inner coil assembly 171, processing gases in the extension volume 142 are exposed to the magnetic field established by the inner coil assembly 171 prior to entering the processing volume 141. As a result, the processing gases in the extension volume 142 may be at least partially ignited in the extension volume 142. The at least partially ignited processing gases then go through the baffle nozzle assembly 155 and enter a central region 141c of the processing volume 141. The magnetic field of the inner coil assembly 171 continuously affects the processing gases in the central region 141c, therefore, further dissociating the processing gases and/or maintaining concentration of the radicals. The combination of the extension volume 142 and the vertical/helical inner coil assembly 171 increases the plasma intensity within the processing, volume 141 without increase power applied to the inner coil assembly 171 or the outer coil assembly 172, thus increasing plasma dissociation efficiency.

In one embodiment, the size of the inner coil assembly 171 or the chamber extension 151 may be adjusted to obtain desired plasma uniformity and/or dissociation efficiency. For example, the uniformity of the plasma density within the processing volume 141 may be increased by increasing the size (such as diameter) of the inner coil assembly 171, or by reducing the size (such as diameter) of the extension volume 142, or both. On the other hand, the gas dissociation efficiency drops when the size of the inner coil assembly 171 increases or the size of the extension volume 142 decreases. In one embodiment, the diameter of the inner coil assembly 171 is between about 2 times to about 4 times of the diameter of the extension volume 142.

The outer coil assembly 172 generally includes two or more horizontal coils disposed close to the lid 143 radially outwards from the inner coil assembly 171. In one embodiment, the outer coil assembly 172 includes two or more horizontal coils arranged in a common plane and disposed above a middle region 141m and an edge region 141e of the processing volume 141.

The horizontal planar configuration of the outer coil assembly 172 allows each winding of the coils in the outer coil assembly 172 to be physically close to the processing volume 141, thus improving coupling with between the magnetic field of the outer coil assembly 172 and the plasma within the processing volume 141. The improved coupling is particularly beneficial to processes where lower plasma power and/or low density of processing gases is required. The horizontal configured of the outer coil assembly 172 also allows coils of the outer coil assembly 172 to distribute across the area directly above the middle region 141m and the edge region 141e of the processing volume 141 thus improving plasma uniformity in the processing volume 141 or at least providing means to improve plasma uniformity in the processing volume 141.

Figure 4:
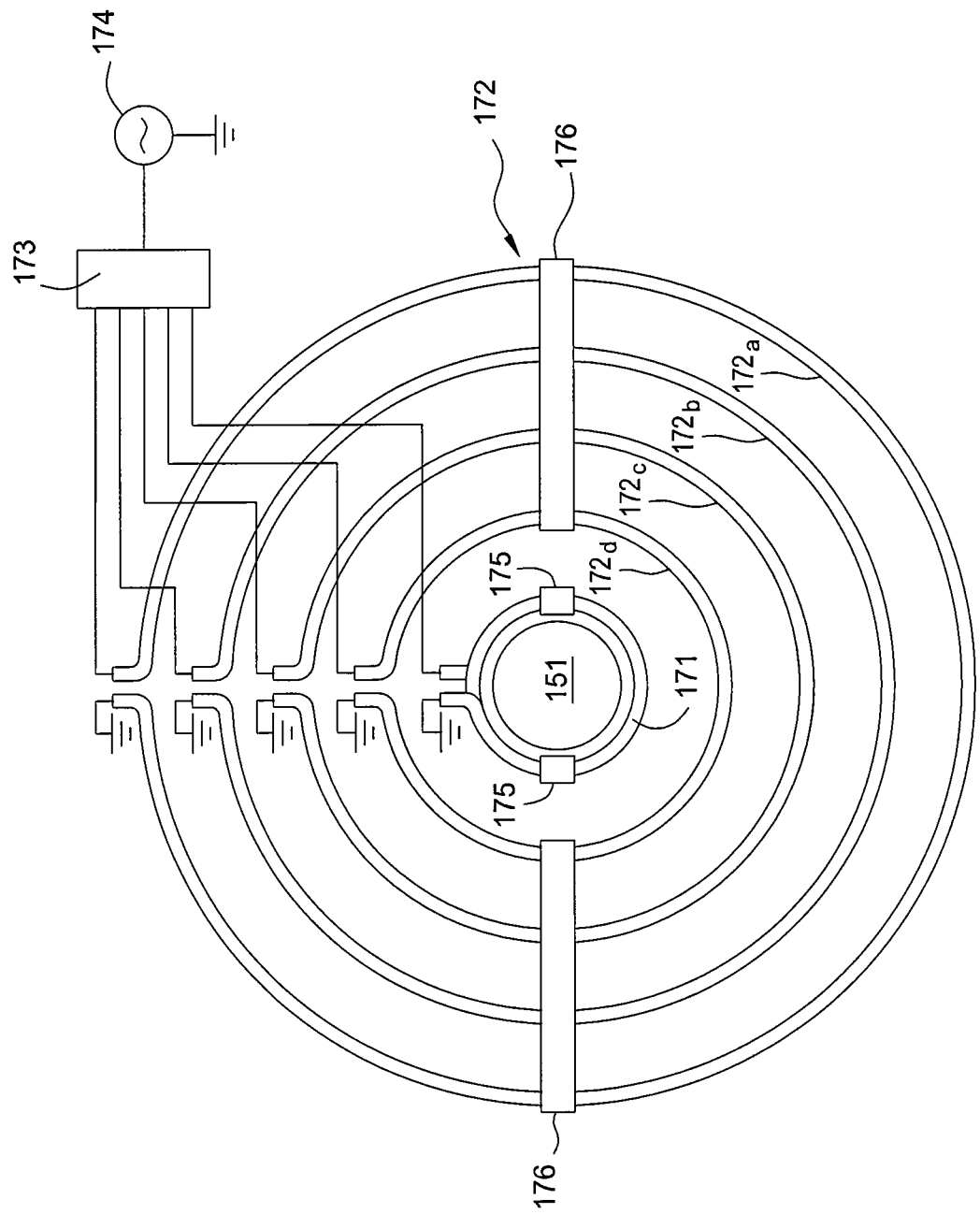
FIG. 4 depicts a top view of the coil assembly of the plasma processing chamber of FIG. 2.

FIG. 4 depicts a top view of the plasma processing chamber 100 showing one configuration of the outer coil assembly 172. In one embodiment, the outer coil assembly 172 includes two or more horizontal coils 172a, 172b, 172c, 172d concentrically arranged. The two or more horizontal coils 172a, 172b, 172c, 172d are connected to the matching network 173 and the RF power source 174. In one embodiment, each of the two or more horizontal coils 172a, 172b, 172c, 172d is a single turn coil parallelly connected to the matching network 173 and the RF power source 174 as shown in FIG. 4.

In one embodiment, the helical coil of the inner coil assembly 171 is also parallelly with the coils of the outer coil assembly 172. Therefore, power from the RF power source 174 may be distributed between the inner coil assembly 171 and the outer coil assembly 172 according to the number of coils in each assembly. In one embodiment, the outer coil assembly 172 includes four single turn coils parallelly connected to the matching network 173 and the RF power 174, and the inner coil assembly 171 includes one helical coil connected in parallel, thus the power between the outer coil assembly 172 and the inner coil assembly 171 is at least 3:1, for example 4:1.

The diameter of the two or more horizontal coils 172a, 172b, 172c, 172d may be adjusted to adjust power distribution and improve uniformity. Additionally, power level supplied to the two or more horizontal coils 172a, 172b, 172c, 172d may be individually adjusted to improve uniformity.

It should be noted that the two or more coils 172a, 172b, 172c, 172d of the outer coil assembly 172 may have any suitable designs that serve the purpose of bringing coils closer to the processing volume where plasma is generated for improved coupling and/or to adjust power distribution across the processing volume.

It should be noted, that the inner coil assembly 171 and the outer coil assembly 171 may have other shapes according to application, for example to match a certain shape of a chamber wall, or to achieve symmetry or asymmetry within a processing chamber. In one embodiment, the inner coil assembly 171 and the outer coil assembly 172 may have a shape of hyper-rectangle.

Referring to FIG. 2, the plasma processing chamber 100 further includes a controller 110 configured to control components of the plasma processing chamber 100, as well as facilitate an optional data exchange with databases of an integrated circuit fabrication. The controller 110 includes a central processing unit (CPU) 114, a memory 112, and support circuits 116.

The controller 110 may be used to adjust the disassociation rate of processing gas by adjusting power level, such as current, of the inner coil assembly 171. Increasing the current provided to the inner coil assembly 171 may increase the dissociation rate of the processing gas. In one embodiment, the controller 110 may adjust the uniformity and/or intensity of a plasma in the processing volume 141 by adjusting current levels of the inner coil assembly 171.

Figure 5:
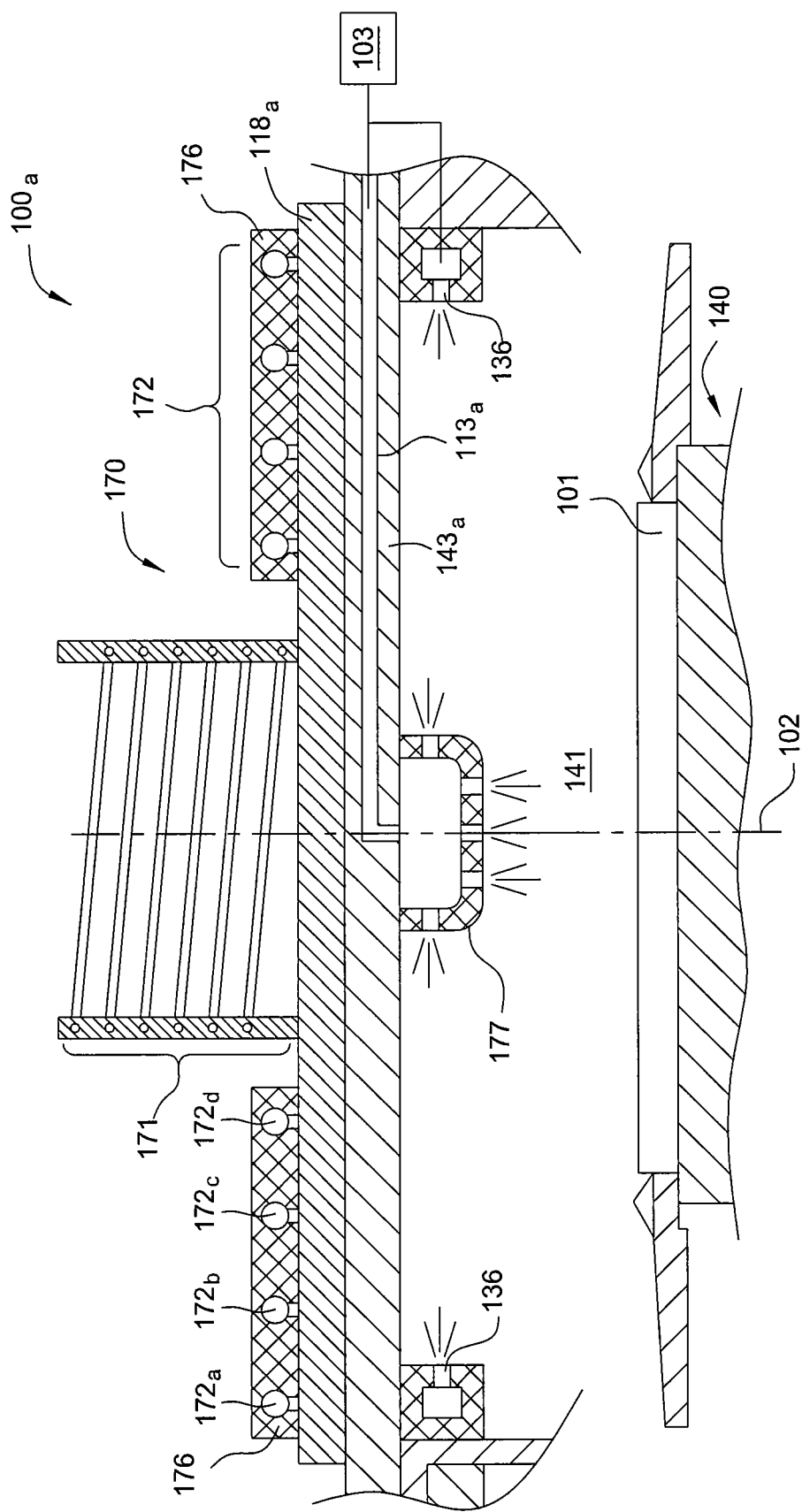
FIG. 5 depicts a partial enlarged sectional view of a plasma processing chamber in accordance with another embodiment of the present invention.

In an alternative embodiment shown in FIG. 5, a plasma processing chamber 100a include a simple central nozzle 177 in place of the chamber extension 151 and the baffle nozzle assembly 155. In one embodiment, the central nozzle 177 may be aligned with the central axis 102 within the processing volume 141. The central nozzle 177 is configured to deliver processing gases to the processing volume 141 from the gas delivery system 103 via a channel 113a formed in the lid 143a. In the plasma processing chamber 100a, a heater 118a does not include any central opening to accommodate the chamber extension 151. As a result, the heater 118a can cover the enter lid 143a with improved uniformity in heating. The inner coil assembly 171 is disposed above the central nozzle 177, the lid 143a and the heater 118a. The inner coil assembly 171 is configured to ignite and maintain a plasma from processing gases entering to the processing volume 141 from the central nuzzle 177.

Embodiments of the present invention may be used to improve uniformity, efficiency, and other quality of plasma processing.

The horizontal coils, in stead of helical coils, in the outer coil assembly provide improved coil to plasma coupling at higher plasma density near the edge region of the plasma volume, usually corresponding to the edge region of the substrate being processed. The improved coil-plasma may be a result of bringing coils physically closer to the plasma. The combination of helical coils in the inner coil assembly and horizontal coils in the outer coil assembly not only provides increased uniformity but also provides improved disassociation rates because the helical coil in the inner coil assembly increases interactions between the magnetic field from the coil assembly and the processing gases.

Embodiments of the present invention also benefit plasma processing at low power level and/or at low density level. For example, during fabrication of masks for photolithography, chromium etching is usually performed at a low power level, such as less than about 500 W, for example at about 250 W. The close proximity of the coil enables certain process gases which are difficult to ignite and maintain in plasma to be utilized at these low power levels. For example, $SF_6$ may be used to plasma etch chromium in photomask applications using less than 500 W, for example 250 W, of source power applied to the outer coil assembly 172, even in applications where the $SF_6$ gas is highly diluted, for example, with up to 20 times with He by volume. Thus, lower power processes which could not have been performed in traditional plasma reactors are enabled. Any processing gas that is difficult to ignite a plasma may be benefited from embodiments of the present invention. For example, embodiments of the present invention may be used for easy ignition of plasma from a precursor including $C_xF_y$ (where x and y can be different allowed combinations), $O_2$, or $NF_3$. Embodiments of the present invention improve low power level/low density plasma generation by bringing coils closer to the plasma volume and distributing power between inner and outer coil assemblies.

Embodiments of the present invention may also be used in etching a profile, such as a deep trench and through silicon vias (TSV), in a silicon substrate having oxide and metal layers disposed on the substrate. Embodiments of the present invention may also be used in etching other types of materials.

Additionally, other processes selected from the group consisting of etching, chemical vapor deposition, physical vapor deposition, implanting, nitriding, annealing, plasma treating, and ashing, among other plasma processes, may also benefit from embodiments of the present invention.

While the foregoing is directed to embodiments of the present invention, other and further embodiments of the invention may be devised without departing from the basic scope thereof, and the scope thereof is determined by the claims that follow.

What is claimed is:

1. A plasma chamber, comprising:
   a chamber body having sidewalls and a lid, wherein the chamber body defines a processing volume;
   a coil assembly disposed over the lid configured to generate inductively coupled plasma within the processing volume, wherein the coil assembly comprises:
     two or more horizontal coils arranged in a common horizontal plane; and
     an inner coil disposed radially inward of the two or more horizontal coils, wherein the inner coil is a helical coil, the inner coil and the two or more horizontal coils are connected in parallel;
   a chamber extension disposed within the inner coil near a center of the lid, wherein the chamber extension defines an extension volume; and
   a nozzle disposed between the processing volume and the extension volume, wherein the nozzle directs one or more processing gases into the processing volume through the extension volume.

2. The plasma chamber of claim 1, wherein the two or more horizontal coils are concentric circles, and the inner coil and the two or more horizontal coils are co-axially positioned.

3. The plasma chamber of claim 2, further comprising a RF power source coupled to the two or more horizontal coils in parallel.

4. The plasma chamber of claim 3, wherein the two or more horizontal coils are single turn coils disposed close to the lid.

5. The plasma chamber of claim 1, wherein the inner coil surrounds the chamber extension and is configured to ignite and maintain a plasma within the extension volume.

6. The plasma chamber of claim 1, further comprising a plurality of nozzles positioned at an edge region of the processing volume, wherein the plurality of nozzles are configured to inject one or more processing gases radially inward to the processing volume.

7. A plasma processing system, comprising:
   a chamber body having sidewalls and a lid, wherein the chamber body defines a processing volume therein;
   a substrate support disposed in the processing volume configured to support a substrate during processing;
   a coil assembly disposed over the lid and configured to generate a plasma within the processing volume, wherein the coil assembly comprises:
     an inner coil assembly positioned about a central axis of the substrate support; and
     an outer coil assembly having two or more horizontal coils disposed radially outward of the inner coil assembly, wherein the outer coil assembly is arranged in a common horizontal plane, the inner coil assembly and the two or more horizontal coils of the outer coil assembly are connected in parallel;
   a chamber extension disposed within the inner coil assembly over a center opening of the lid, wherein the chamber extension defines an extension volume; and
   a nozzle disposed in the center opening of the lid, wherein the nozzle fluidly connects the processing volume and the extension volume.

8. The plasma processing system of claim 7, wherein the inner coil assembly is a helical coil.

9. The plasma processing system of claim 8, wherein the inner coil assembly surrounds the chamber extension and is configured to ignite and maintain a plasma within the extension volume.

10. The plasma processing system of claim 8, wherein the outer coil assembly is disposed close to the lid to improve coil-plasma coupling.

11. The plasma processing system of claim 10, wherein each of the two or more horizontal coils is a single turn coil, and the two or more horizontal coils are connected to a RF power source in parallel.

12. The plasma processing system of claim 7, further comprising a heater disposed over the lid, and the outer coil assembly is disposed over the heater.

13. The plasma processing system of claim 7, further comprising a plurality of nozzles positioned at an edge region of the processing volume, wherein the plurality of nozzles are configured to inject one or more processing gases radially inward to the processing volume.

* * * * *